(12) United States Patent
Hua et al.

(10) Patent No.: US 7,362,580 B2
(45) Date of Patent: Apr. 22, 2008

(54) ELECTRONIC ASSEMBLY HAVING AN INDIUM WETTING LAYER ON A THERMALLY CONDUCTIVE BODY

(75) Inventors: Fay Hua, San Jose, CA (US); Thomas J. Fitzgerald, Phoenix, AZ (US); Carl L. Deppisch, Chandler, AZ (US); Gregory M. Chrysler, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 202 days.

(21) Appl. No.: 10/871,978

(22) Filed: Jun. 18, 2004

(65) Prior Publication Data

US 2005/0280142 A1    Dec. 22, 2005

(51) Int. Cl.
*H05K 7/20* (2006.01)
(52) U.S. Cl. .................. 361/709; 361/704; 361/705
(58) Field of Classification Search ........ 361/700–710; 257/700–704
See application file for complete search history.

(56) References Cited

U.S. PATENT DOCUMENTS

| | | | | |
|---|---|---|---|---|
| 4,817,854 | A | * | 4/1989 | Tihanyi et al. ............ 228/124.1 |
| 5,396,403 | A | * | 3/1995 | Patel ........................ 361/705 |
| 5,931,222 | A | * | 8/1999 | Toy et al. .................. 165/80.3 |
| 6,084,775 | A | * | 7/2000 | Bartley et al. .............. 361/705 |
| 6,111,322 | A | * | 8/2000 | Ando et al. ................ 257/778 |
| 6,504,242 | B1 | | 1/2003 | Deppisch et al. ........... 257/707 |
| 6,504,723 | B1 | | 1/2003 | Fitzgerald et al. .......... 361/705 |
| 6,549,407 | B1 | | 4/2003 | Sauciuc et al. ............ 361/699 |
| 6,653,730 | B2 | | 11/2003 | Chrysler et al. ........... 257/704 |
| 6,667,548 | B2 | * | 12/2003 | O'Connor et al. .......... 257/712 |
| 6,706,562 | B2 | | 3/2004 | Mahajan et al. ........... 438/125 |
| 6,709,898 | B1 | | 3/2004 | Ma et al. ................... 438/122 |
| 6,751,099 | B2 | | 6/2004 | Vrtis et al. ................. 361/705 |
| 6,813,153 | B2 | | 11/2004 | Koning et al. ............. 361/700 |
| 6,833,289 | B2 | | 12/2004 | Hu et al. ................... 438/121 |
| 6,867,978 | B2 | | 3/2005 | Whittenburg et al. ....... 361/719 |
| 7,036,573 | B2 | | 5/2006 | Koning et al. ............. 165/185 |
| 2002/0074649 | A1 | | 6/2002 | Chrysler et al. ........... 257/720 |
| 2002/0105071 | A1 | | 8/2002 | Mahajan et al. ........... 257/720 |
| 2003/0117775 | A1 | | 6/2003 | Vrtis et al. ................. 361/705 |
| 2003/0127715 | A1 | | 7/2003 | Liu et al. ................... 257/678 |
| 2003/0150604 | A1 | | 8/2003 | Koning et al. ............. 165/185 |
| 2004/0052050 | A1 | | 3/2004 | Koning et al. ............. 361/700 |
| 2004/0066630 | A1 | | 4/2004 | Whittenburg et al. ....... 361/719 |

\* cited by examiner

*Primary Examiner*—Tuan T. Dinh
(74) *Attorney, Agent, or Firm*—Konrad Raynes & Victor, LLP; Alan S. Raynes

(57) ABSTRACT

Embodiments include electronic packages and methods for forming electronic packages. One method includes providing a die and a thermal interface material on the die. A metal body is adapted to fit over the die. A wetting layer of a material comprising indium is formed on the metal body. The thermal interface material on the die is brought into contact with the wetting layer of material comprising indium. The thermal interface material is heated to form a bond between the thermal interface material and the wetting layer so that the thermal interface material is coupled to the metal body, and to form a bond between the thermal interface material and the die so that the thermal interface material is coupled to the die.

20 Claims, 3 Drawing Sheets

ELECTRONIC ASSEMBLY HAVING AN INDIUM WETTING LAYER ON A THERMALLY CONDUCTIVE BODY

TECHNICAL FIELD

Embodiments of the present invention relate generally to electronics packaging. More particularly, certain embodiments of the present invention relate to an electronic assembly including a semiconductor die which is thermally coupled through an interface material to a thermally conductive body to dissipate heat, and to manufacturing methods thereof.

RELATED ART

Integrated circuits are generally formed on semiconductor wafers formed from materials such as silicon. The semiconductor wafers are processed to form various electronic devices thereon. The wafers are diced into semiconductor chips, which may then be attached to a package substrate. Such a chip or die may have solder bump contacts on the integrated circuit. The solder bump contacts extend downward onto contact pads of a package substrate, and are typically attached in a thermal reflow process. Electronic signals may be provided through the solder bump contacts to and from the integrated circuit. Operation of the integrated circuit generates heat in the device. Heat is conducted to an upper surface of the die, and should be conducted or convected away to maintain the temperature of the integrated circuit below a predetermined level for purposes of maintaining functional integrity of the integrated circuit.

One way to conduct heat from an integrated circuit die is through the use of a heat spreader, which may be positioned above the die and thermally coupled to the die through a thermal interface material.

BRIEF DESCRIPTION OF THE DRAWINGS

Embodiments are described by way of example, with reference to the accompanying drawings, which are not drawn to scale, wherein.

DETAILED DESCRIPTION

U.S. Pat. No. 6,504,242 describes an electronic assembly including a die and a heat spreader. The heat spreader has a nickel layer formed thereon, and a gold wetting layer on the nickel layer. The nickel layer acts as a diffusion barrier. The purpose of the gold layer is to serve as a wetting layer for an indium preform positioned between the heat spreader and the die. The stack is heated and cooled to "solder" the indium to the gold. During this operation an intermetallic layer including indium and gold ($AuIn_2$) is typically also formed.

Applicants have observed that thermal degradation of such an electronic assembly as described in U.S. Pat. No. 6,504,242 may occur. The thermal degradation may result in failures due to crack propagation between the indium-gold intermetallic layer and the indium layer.

Figure 1:
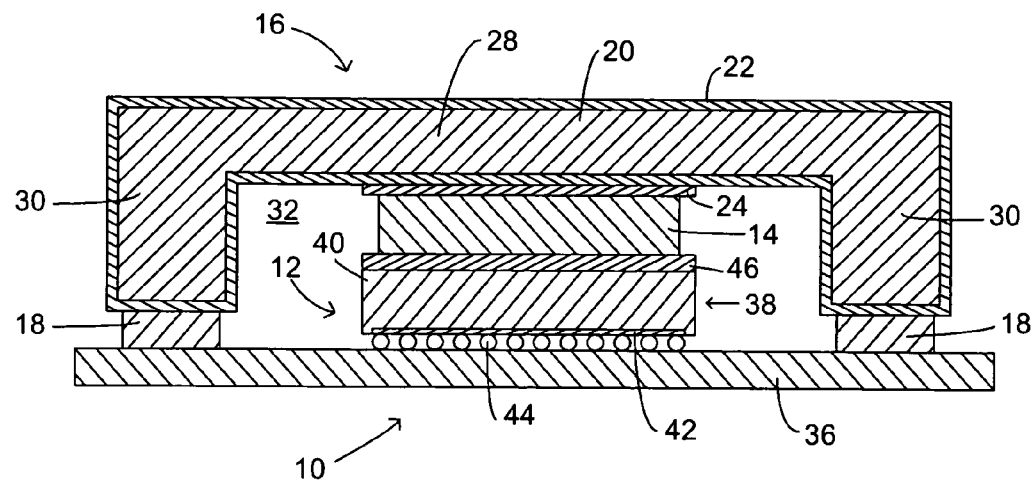
FIG. 1 is a cross-sectional side view of components of an electronic assembly in accordance with an embodiment of the present invention, before being finally assembled.

FIG. 1 of the accompanying drawings illustrates components of an electronic assembly 10 according to an embodiment of the present invention, before being finally assembled, including a semiconductor package subassembly 12, a layer 14 of pure indium, a heat spreader subassembly 16, and an adhesive sealant 18. The layer of pure indium 14 is preferably in a preformed state. The preform may be in the form of a foil cut from a ribbon formed using a known process, such as an extrusion and rolling process. Preferably, the indium preform 14 has a thickness in the range of 5-500 microns, more preferably about 200-225 microns.

The heat spreader subassembly 16 preferably includes a primary heat spreading structure 20 of copper, a thin nickel layer 22 plated on the primary heat spreading structure 20, and an indium layer 24 plated on the nickel layer 22. The primary heat spreading structure 20 preferably includes a horizontal heat spreading plate 28, and sides 30 extending downward from edges of the heat spreading plate 28. Preferably, there are four of the sides 30 which, together with the heat spreading plate 28, form a lid or cap with an internal cavity 32 which is open to the bottom. All surfaces of the primary heat spreading structure 20 are preferably plated with the nickel layer 22, as illustrated in FIG. 1. The nickel layer may act as a protective layer and diffusion barrier, depending on the specific materials being used.

The indium layer 24 is preferably selectively plated on an area of the nickel layer 22 located on the lower surface of the heat spreading plate 28, as illustrated in FIG. 1. The indium layer 24 may be formed by first masking surfaces of the nickel layer 22 where the indium layer 24 is not required, plating on exposed surfaces of the nickel layer 22, and subsequently removing any masking material on surfaces of the nickel layer 22 where the indium layer 24 was prevented from plating.

The indium layer 24 serves as a wetting layer for the indium preform 14. Indium does not easily bond to nickel oxide, which may be formed on the nickel surface due to oxidation. By plating the indium onto the nickel layer, the plating process acts to clean the nickel surface so that the indium is formed in contact with nickel and a good bond will result. Certain preferred embodiments will utilize a wet plating process as known in the art for plating the indium to the nickel on the heat spreading structure 20. The indium wetting layer 24 in certain embodiments may be formed to a thickness of about 1 micron (μm) or less, for example, about 0.2 μm. Other embodiments may, if desired, utilize a wetting layer greater than 1 μm or less than 0.2 μm.

The semiconductor package subassembly 12 preferably includes a package substrate 36 and a semiconductor die 38. The package substrate 36 may be made of a material such as, for example, an organic plastic material. Other package materials, including, but not limited to ceramics, may also be used. The semiconductor die 38 typically includes a semiconductor substrate 40 having an integrated circuit 42 of semiconductor electronic components and metal lines in a lower surface thereof.

The semiconductor die 38 may further include solder bumps 44 formed on a lower surface of the integrated circuit 42, as illustrated in FIG. 1. The solder bumps 44 are typically formed according to the known controlled collapse chip connect (C4) process. The solder bumps 44 are structurally secured to the semiconductor substrate 40 using a known reflow process. The solder bumps 44 are also electrically connected to the integrated circuit 42, so that signals can be provided through the solder bumps 44 to and from the integrated circuit 42. The semiconductor die 38 also may include a stack 46 of layers formed on an upper surface of the semiconductor substrate 40. The stack 46 preferably includes a titanium layer, a nickel vanadium alloy layer, and a gold layer, which are sequentially deposited on top of one another. The preform of indium 14 is preferably approximately 225 μm thick, has a thermal conductivity of approximately 80 W/mK, and is located on an upper surface of the gold layer of the stack 4, as illustrated in FIG. 1. Other preform thicknesses are also possible. In addition, if the preform is made of a material other than pure indium, the thermal conductivity may also vary from 80 W/mK.

An adhesive sealant 18 is located on lower surfaces of the sides 30 of the heat spreader structure 20. The heat spreader subassembly 16 is located over the semiconductor die 38 and the preform of indium 14. Lower surfaces of the adhesive sealant 18 contact an upper surface of the package substrate 36 as illustrated in FIG. 1. A lower surface of the indium wetting layer 24 contacts an upper surface of the preform of indium 14. The preform 14 may be in the form of a foil.

A clamp (not shown) is then located over the components of the electronic assembly 10, and the electronic assembly 10, together with the clamp, is heated. The heating may be carried out by sending the clamped electronic assembly through a reflow furnace. A flux material as know in the art may be used, although in certain embodiments a flux may not be necessary. The components of the electronic assembly 10 are heated in the reflow furnace, and subsequently allowed to cool. The reflow furnace heats the components of the electronic assembly 10 to a temperature of, for example, approximately 180° C. Such a temperature is above a melting temperature of pure indium, which is approximately 157° C. The temperature may preferably be about 20-30° C. above the melting point of the preform material.

Figure 2:
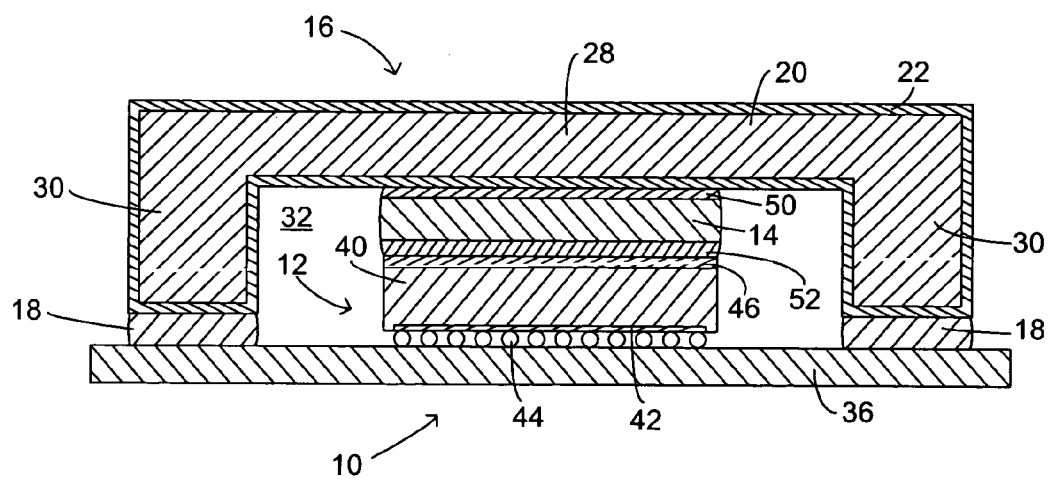
FIG. 2 is a view of the electronic assembly of FIG. 1, after heating of the assembly, in accordance with an embodiment of the present invention.

FIG. 2 illustrates the electronic assembly 10 after it is allowed to cool. Cooling of the indium 14 results in its solidification. By heating and cooling the indium 14, the indium is "soldered" to both the indium layer 24 and the gold layer of the stack 46. A highly effective path for heat to conduct from the die 38 to the heat spreading structure 20 is formed. The sides 30 of the heat spreading structure 20 are also secured to the substrate 36 by the adhesive sealant 18.

The order that the various sections of the assembly 10 are assembled may be varied. For example, if desired, the die 38 may be attached to the package substrate prior to placing the preform 14 on the die 40 and prior to placing the heat spreader assembly (with wetting layer 24) on the preform 14 and prior to heating the assembly to melt the preform 14 and couple the sections together. Alternatively, the die 38 could be coupled to the package substrate 36 after heating the assembly and coupling the sections together.

In use, electronic signals are transmitted through the solder bumps 44 between the package substrate 36 and the integrated circuit 42. Operation of the integrated circuit 42 causes heating of the semiconductor die 38. Heat transfers from the semiconductor die 38 through the indium 14 thermal interface material to the heat spreader subassembly 16. The heat spreads sideways through the heat spreader subassembly 16 and is conducted or convected from an upper surface of the heat spreader subassembly 16.

Figure 3:
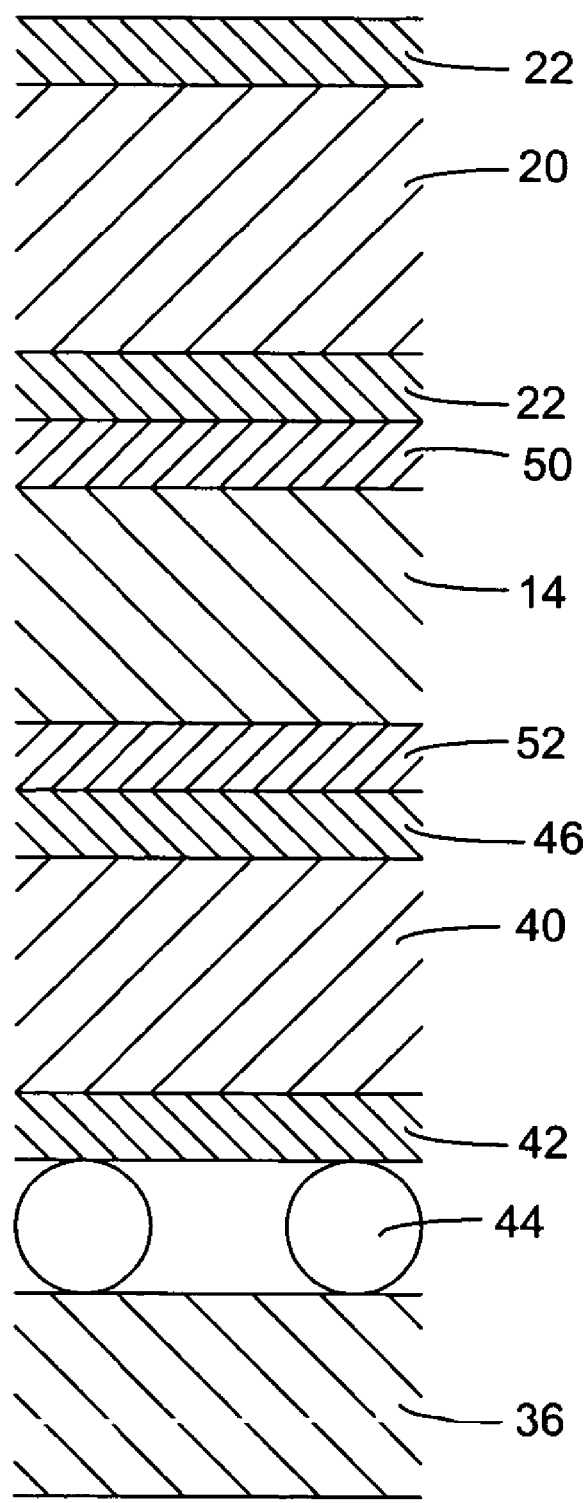
FIG. 3 is a cross-sectional view illustrating certain aspects of the electronic assembly of the embodiment shown in FIG. 2 in greater detail.

FIG. 3 is a cross-sectional view showing the components of the assembly 10 of FIG. 2 in greater detail. Some of the nickel layer 22 and indium layer 24 are consumed to form a nickel-indium intermetallic 50. In addition, a gold-indium intermetallic layer 52 is formed by some of the indium from the indium layer 14 and the gold layer of the stack 46.

Figure 4:
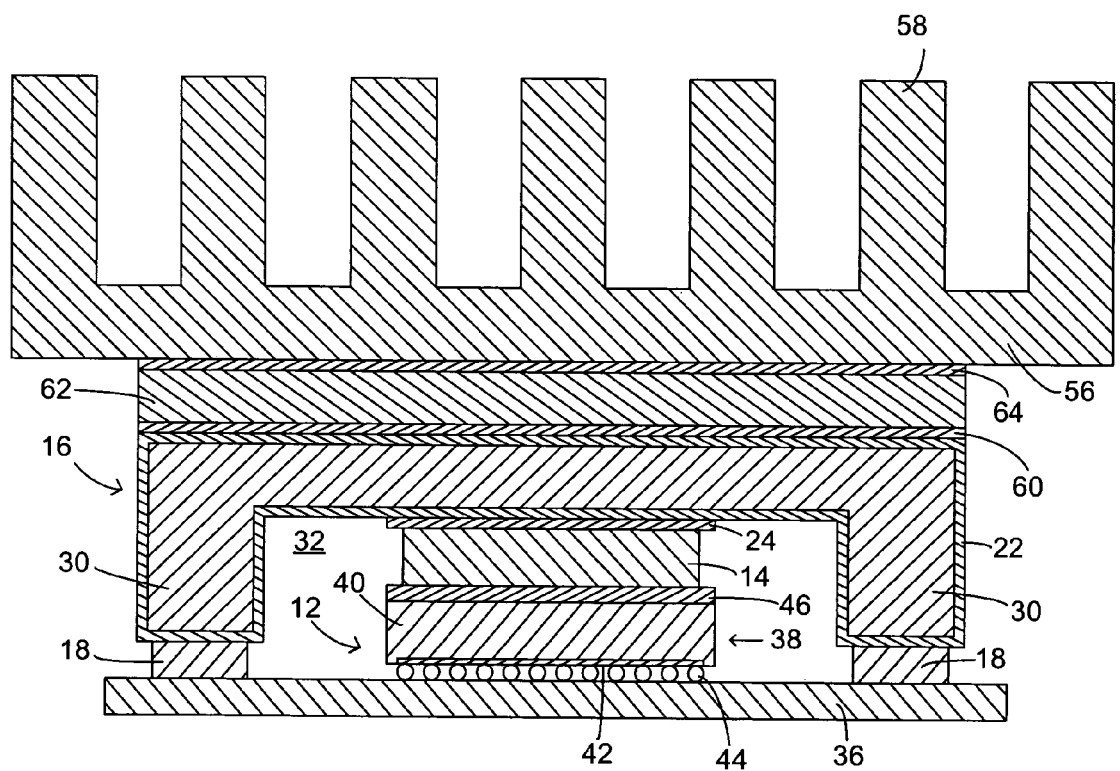
FIG. 4 is a cross-sectional view of an embodiment including a heat sink, in accordance with an embodiment of the present invention, before being finally assembled.

FIG. 4 is a cross-sectional view of an embodiment showing the components of FIG. 1 and further including a heat sink 56. The heat sink 56 includes fins 58. The heat sink 56 may be coupled to the heat spreading structure 20 using a similar manner to that described above for coupling the die and the heat spreading structure 20, with an indium wetting layer 60 on the nickel layer 22 on the heat spreading structure 20, a preform 62 (which may be the same as preform 14 described above), and another indium wetting layer 64 on a surface of the body heat sink 56. In such an embodiment, the heat sink 56 may include a layer such as nickel that the indium wetting layer is bonded to. Another embodiment may omit the heat spreader subassembly 16.

A variety of modifications to the embodiments may also be made. For example, in certain embodiments, a wetting layer formed from indium may be coupled to a variety of bodies including, but not limited to the heat spreading structure 20 and the heat sink 56 described above. Such bodies may have a variety of sizes, geometries and materials. For example, the heat spreading structure 20 may be formed from other materials including, but not limited to aluminum.

Furthermore, depending on the materials used, in certain embodiments the indium wetting layer may be formed directly on a body without the need of an intermediate layer such as a nickel layer. In addition, in certain embodiments a variety of materials in addition to pure indium may be used as the preform material, including, for example, indium alloys such as indium-tin and indium-bismuth. Other materials including, for example, tin and tin alloys may also be utilized in certain embodiments as the perform material. Certain embodiments may also replace or modify one or more materials of the stack 46 on the semiconductor substrate 40. For example, the gold layer in the tri-stack may in certain embodiments be replaced with indium.

While certain exemplary embodiments have been described above and shown in the accompanying drawings, it is to be understood that such embodiments are merely illustrative and not restrictive of the current invention, and that this invention is not restricted to the specific constructions and arrangements shown and described since modifications may occur to those having ordinary skill in the art.

What is claimed:

1. An electronic assembly comprising:
    a thermally conductive body comprising a material selected from the group consisting of copper and aluminum;
    a semiconductor die;
    a layer comprising nickel, positioned between the thermally conductive body and the semiconductor die;
    a layer comprising indium, positioned between the layer comprising nickel and the semiconductor die;
    a layer comprising an intermetallic comprising indium and nickel, positioned between the layer comprising nickel and the layer comprising indium; and
    the assembly including no gold between the layer comprising indium and the thermally conductive body.

2. The electronic assembly of claim 1, further comprising a substrate to which the die and the thermally conductive body are coupled.

3. The electronic assembly of claim 1, wherein the thermally conductive body is selected from the group consisting of a heat spreader and a heat sink.

4. An electronic assembly comprising:
a heat spreading structure;
a semiconductor die;
a first layer comprising indium, positioned between the heat spreading structure and the semiconductor die;
a second layer comprising indium and nickel, positioned between the heat spreading structure and the first layer; and
a third layer comprising nickel, positioned between the heat spreading structure and the second layer.

5. The electronic assembly of claim 4, wherein the second layer comprises an intermetallic.

6. The electronic assembly of claim 4, wherein the first layer is pure indium.

7. The electronic assembly of claim 4, wherein the third layer is in direct contact with the heat spreading structure, the second layer is in direct contact with the third layer, and the first layer is in direct contact with the second layer.

8. The electronic assembly of claim 4, further comprising a plurality of solder bumps and a substrate, the solder bumps positioned between the substrate and the semiconductor die.

9. The electronic assembly of claim 7, wherein the first layer is selected from the group consisting of pure indium, an alloy including indium and tin, and an alloy including indium and bismuth.

10. The electronic assembly of claim 9, wherein the heat spreading structure is shaped in the form of a lid.

11. An electronic assembly comprising:
a heat spreading structure including a nickel layer coupled thereto;
a semiconductor die;
a first layer comprising an indium layer positioned between the nickel layer and the semiconductor die;
a second layer comprising indium and nickel, positioned between the nickel layer and the first layer comprising an indium layer; and
a substrate, wherein the die is coupled to the substrate.

12. The electronic assembly of claim 11, wherein the second layer comprises an intermetallic.

13. The electronic assembly of claim 11, wherein the first layer is pure indium.

14. The electronic assembly of claim 11, wherein the nickel layer is in direct contact with the heat spreading structure, the second layer is in direct contact with the nickel layer, and the first layer is in direct contact with the second layer.

15. The electronic assembly of claim 11, wherein the first layer is selected from the group consisting of pure indium, an alloy including indium and tin, and an alloy including indium and bismuth.

16. The electronic assembly of claim 11, wherein the second layer comprises an intermetallic.

17. The electronic assembly of claim 11, wherein the heat spreading structure comprises a lid that covers the die and includes sides that are coupled to the substrate.

18. The electronic assembly of claim 11, wherein the electronic assembly includes no gold between the first layer comprising an indium layer and the nickel layer.

19. The electronic assembly of claim 11, wherein the heat spreading structure is a first heat spreading structure, the assembly further comprising:
a second heat spreading structure including a nickel layer coupled thereto, wherein the first heat spreading structure is positioned between the second heat spreading structure and the die;
a third layer comprising an indium layer between the first heat spreading structure and the second heat spreading structure; and
a fourth layer comprising indium and nickel positioned between the fourth layer and the nickel layer coupled to the second heat spreading structure.

20. The electronic assembly of claim 19, wherein the first heat spreading structure comprises a plate and sides extending downward from edges of the plate to create a lid that covers the die and is coupled to the substrate, and wherein the second heat spreading structure comprises a heat sink with fins.

* * * * *

UNITED STATES PATENT AND TRADEMARK OFFICE
CERTIFICATE OF CORRECTION

| | |
|---|---|
| PATENT NO. | : 7,362,580 B2 |
| APPLICATION NO. | : 10/871978 |
| DATED | : April 22, 2008 |
| INVENTOR(S) | : Hua et al. |

It is certified that error appears in the above-identified patent and that said Letters Patent is hereby corrected as shown below:

Column 5, line 26, in claim 10, please delete "9" and insert --8-- in its place.

Signed and Sealed this
Twelfth Day of July, 2011

David J. Kappos
*Director of the United States Patent and Trademark Office*